(12) United States Patent
Kim et al.

(10) Patent No.: US 11,474,559 B2
(45) Date of Patent: Oct. 18, 2022

(54) DISPLAY DEVICE

(71) Applicant: Samsung Display Co., LTD., Yongin-si (KR)

(72) Inventors: Min-Sung Kim, Hwaseong-si (KR); Kyu Young Kim, Suwon-si (KR); Hansun Ryou, Seoul (KR); Sanghyo Park, Suwon-si (KR); Hyoyul Yoon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/022,636

(22) Filed: Sep. 16, 2020

(65) Prior Publication Data

US 2021/0191459 A1 Jun. 24, 2021

(30) Foreign Application Priority Data

Dec. 19, 2019 (KR) .......................... 10-2019-0170829

(51) Int. Cl.
*G06F 1/16* (2006.01)

(52) U.S. Cl.
CPC .......... *G06F 1/1616* (2013.01); *G06F 1/1626* (2013.01)

(58) Field of Classification Search
CPC .... G06F 1/1616; G06F 1/1626; G06F 1/1637; G06F 1/1641; G06F 1/1681
See application file for complete search history.

(56) References Cited

U.S. PATENT DOCUMENTS

| 9,420,215 B2 | 8/2016 | Jean et al. | |
| 9,442,585 B2 | 9/2016 | Park et al. | |
| 10,620,668 B2* | 4/2020 | Park | G06F 1/1681 |
| 2012/0307423 A1* | 12/2012 | Bohn | H04M 1/0216 |
| | | | 361/679.01 |
| 2016/0103539 A1* | 4/2016 | Jinbo | G06F 1/1652 |
| | | | 345/173 |
| 2016/0209874 A1* | 7/2016 | Choi | G06F 1/1641 |
| 2016/0357052 A1* | 12/2016 | Kim | G06F 1/1652 |
| 2017/0060188 A1* | 3/2017 | Han | G06F 1/1641 |
| 2018/0098442 A1* | 4/2018 | Han | H04M 1/0266 |
| 2018/0190936 A1 | 7/2018 | Lee et al. | |
| 2018/0343756 A1* | 11/2018 | Lin | G02F 1/16753 |
| 2019/0018459 A1* | 1/2019 | Hong | G06F 1/1616 |
| 2019/0107866 A1* | 4/2019 | Han | G06F 3/0416 |
| 2019/0334114 A1* | 10/2019 | Park | H01L 51/0097 |
| 2019/0357366 A1* | 11/2019 | Choi | B32B 27/365 |
| 2020/0019212 A1* | 1/2020 | Jung | G06F 1/1652 |
| 2020/0209998 A1* | 7/2020 | Shin | G06F 3/044 |

(Continued)

FOREIGN PATENT DOCUMENTS

| KR | 101325913 B1 | 11/2013 |
| KR | 101507503 B1 | 3/2015 |
| KR | 1020170061313 A | 6/2017 |

(Continued)

*Primary Examiner* — Abhishek M Rathod
(74) *Attorney, Agent, or Firm* — Cantor Colburn LLP

(57) ABSTRACT

A display device includes a display module including a first region, a second region and a third region arranged in order; a first plate corresponding to the first region of the display module; a second plate corresponding to the third region of the display module and spaced apart from the first plate at the second region of the display module; and a cover film attached to the first plate and the second plate.

19 Claims, 9 Drawing Sheets

(56) References Cited

U.S. PATENT DOCUMENTS

2021/0201710 A1   7/2021   Kim et al.

FOREIGN PATENT DOCUMENTS

| KR | 1020170064165 A | 6/2017 |
| KR | 1020180036323 A | 4/2018 |
| KR | 1020180079091 A | 7/2018 |
| KR | 1020190003257 A | 1/2019 |
| KR | 1020210086745 A | 7/2021 |

* cited by examiner

DISPLAY DEVICE

This application claims priority to Korean Patent Application No. 10-2019-0170829 filed on Dec. 19, 2019, and all the benefits accruing therefrom under 35 U.S.C. § 119, the disclosure of which is hereby incorporated by reference in its entirety.

BACKGROUND

(1) Field

The invention relates to a display device with increased product reliability.

(2) Description of the Related Art

Display devices display various images on a display screen to provide information to users. In general, a display device displays information within a display screen of a display panel. Flexible display devices have been developed to include flexible display panels capable of being folded.

SUMMARY

One or more embodiment provides a display device with increased product reliability.

According to an embodiment, a display device includes a display module including a first region, a second region and a third region arranged in order; a first plate corresponding to the first region of the display module; a second plate corresponding to the third region of the display module and spaced apart from the first plate at the second region of the display module; and a cover film attached to the first plate and the second plate.

In an embodiment, the cover film may include: a first attachment region attached to the first plate; a second attachment region attached to the second plate; and a connection region between the first attachment region and the second attachment region. The connection region may include a plurality of bent portions.

In an embodiment, the first attachment region may be attached to a bottom surface of the first plate. The second attachment region may be attached to a bottom surface of the second plate.

In an embodiment, the plurality of bent portions may be in a gap between the first plate and the second plate.

In an embodiment, the plurality of bent portions may include: a first bent portion between the first plate and the display module; and a second bent portion between the second plate and the display module.

In an embodiment, the plurality of bent portions may include: a first bent portion below the first plate; and a second bent portion below the second plate.

In an embodiment, the cover film may cover a portion of a side surface of the first plate and a portion of a side surface of the second plate.

In an embodiment, the display device may further include: a first adhesive layer between the cover film and the first plate; and a second adhesive layer between the cover film and the second plate.

In an embodiment, the first adhesive layer may have a bar shape which extends along a first direction. The second adhesive layer may have a bar shape which extends along the first direction.

In an embodiment, a length along the first direction of each of the first and second adhesive layers may be substantially the same as a width of the cover film along the first direction.

In an embodiment, the first adhesive layer may include: a first adhesive region which extends along a first direction; a second adhesive region which extends along a second direction from one end of the first adhesive region, the second direction intersecting the first direction; and a third adhesive region which extends along the second direction from another end of the first adhesive region. The second adhesive layer may include: a fourth adhesive region which extends along the first direction; a fifth adhesive region which extends along the second direction from one end of the fourth adhesive region; and a sixth adhesive region which extends along the second direction from another end of the fourth adhesive region. The second adhesive region, the third adhesive region, the fifth adhesive region and the sixth adhesive region may each be between the first adhesive region and the fourth adhesive region.

In an embodiment, a width along the first direction of the cover film, may be less than a distance between the second adhesive region and the third adhesive region.

In an embodiment, the first region and the third region may be unfolding areas. The second region may be a folding area.

In an embodiment, a partial region of the first plate may be below the second region. A partial region of the second plate may be below the second region.

In an embodiment, the display module which is unfolded may be flat; and the display module which is folded may dispose the first region and the third region facing each other. The first plate is movable together with folding or unfolding of the display module. The second plate is movable together with the folding or unfolding of the display module. The cover film is deformable together with the folding or unfolding of the display module.

In an embodiment, the cover film may be a flexible film.

In an embodiment, the display device may further include: a first intermediate adhesive layer between the display module and the first plate, the first intermediate adhesive layer overlapping the first region; a first step compensation film between the display module and the first plate, the first step compensation film overlapping the second region; a second intermediate adhesive layer between the display module and the second plate, the second intermediate adhesive layer overlapping the third region; and a second step compensation film between the display module and the second plate, the second step compensation film overlapping the second region.

According to an embodiment, a display device includes a display module which is foldable and unfoldable, the display module including: a folding area at which the display module is foldable, and a first non-folding area and a second non-folding area facing each other with the folding area therebetween; a first plate corresponding to the first non-folding area of the display module, the first plate movable together with the display module; a second plate corresponding to the second non-folding area of the display module and spaced apart from the first plate at the folding area, the second plate movable together with the display module; and a cover film deformable together with the display module and connected between the first plate and the second plate. The first plate and the second plate which are spaced apart from each other, define a gap space therebetween, at the folding area, and the cover film covers the gap space which is between the first plate and the second plate.

In an embodiment, the cover film may include: a first attachment region attached to the first plate; a second attachment region attached to the second plate; and a connection region between the first attachment region and the second attachment region, the connection region including a plurality of bent portions.

In an embodiment, the display device may further include: a first adhesive layer between the cover film and the first plate, the first adhesive layer extending along a first direction; and a second adhesive layer between the cover film and the second plate, the second adhesive layer extending along the first direction. A length along the first direction of each of the first and second adhesive layers may be equal to or greater than a width along the first direction of the cover film.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1A:
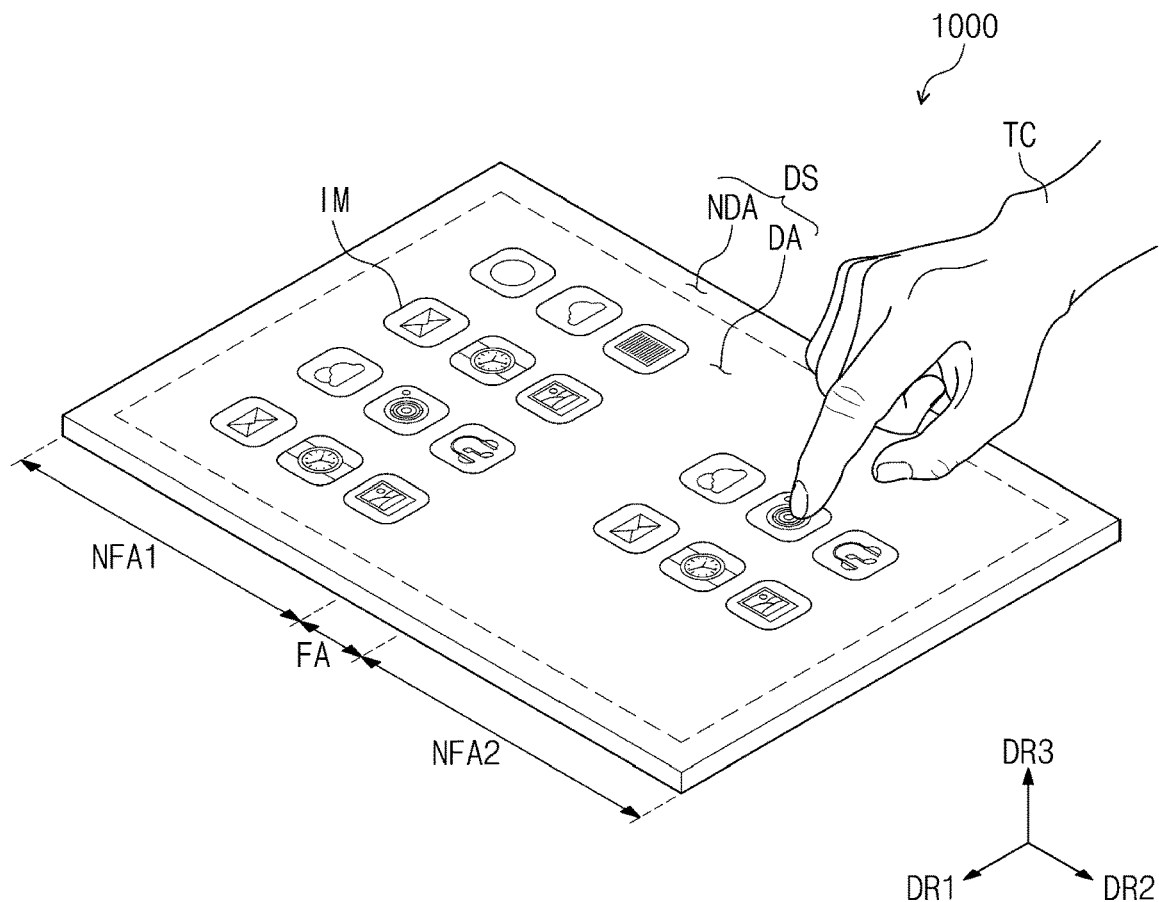
FIG. 1A illustrates a perspective view showing an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this description, when a component (or region, layer, portion, etc.) is referred to as being related to another component such as being "on," "connected to" or "coupled to" other component(s), the component may be directly disposed on, directly connected to, or directly coupled to the other component(s) or at least one intervening component may be present therebetween. In contrast, when a component (or region, layer, portion, etc.) is referred to as being related to another component such as being "directly on," "directly connected to" or "directly coupled to" other component(s), no intervening component is present therebetween.

Like numerals indicate like components. Moreover, in the drawings, thicknesses, ratios, and dimensions of components are exaggerated for effectively explaining the technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the invention. Unless the context clearly indicates otherwise, the singular forms are intended to include the plural forms as well.

In addition, the terms "beneath," "lower," "above," "upper" and the like are used herein to describe one component's relationship to other component(s) illustrated in the drawings. The relative terms are intended to encompass different orientations in addition to the orientation depicted in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

It should be understood that the terms "comprise," "include," "have" and the like are used to specify the presence of stated features, integers, steps, operations, components, elements, or combinations thereof, but do not preclude the presence or addition of one or more other features, integers, steps, operations, components, elements, or combinations thereof.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Unlike rigid display devices, flexible display devices are foldable, rollable or bendable. A flexible display device is deformable into various shapes regardless of a size of the display screen, to thereby improve user convenience in transporting or using the flexible display device.

The following will now describe embodiments of the invention in conjunction with the accompanying drawings.

Figure 1B:
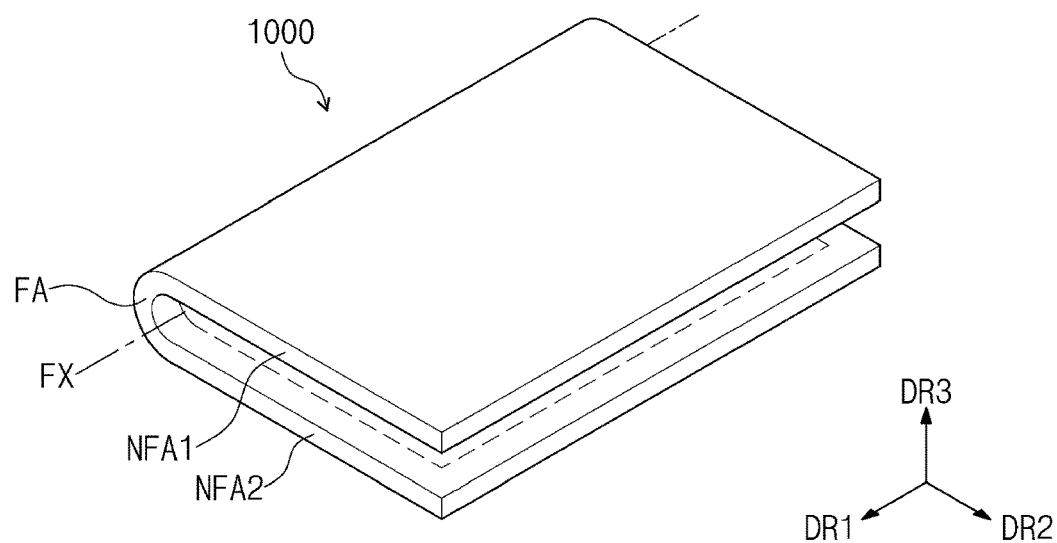
FIG. 1B illustrates a perspective view showing the display device depicted in FIG. 1A, which is folded.

FIG. 1A illustrates a perspective view showing an embodiment of a display device 1000 which is flat or unfolded. FIG. 1B illustrates a perspective view showing the display device 1000 depicted in FIG. 1A, which is bent or folded.

Referring to FIGS. 1A and 1B, a display device 1000 may be a foldable display device. One or more embodiment of the display device 1000 may be applicable not only to relatively large-sized electronic products such as television sets and display monitors, but also to relatively small and medium-sized electronic products such as mobile phones, tablet personal computers ("PCs"), automotive navigation systems, game consoles and smart watches.

A top surface of the display device 1000 may be a display surface DS. The display surface DS in the display device 1000 which is unfolded may be disposed in or parallel to a plane defined by a first direction DR1 and a second direction DR2 which cross each other. A thickness direction of the display device 1000 may be defined along a third direction DR3 which crosses each of the first direction DR1 and the second direction DR2. Various components of the display device 1000 may be disposed in the plane and/or along the thickness direction described above for the display device 1000.

The display surface DS may include a display area DA and a non-display area NDA which is adjacent to the display area DA, such as surrounding the display area DA in the top plan view. Various components of the display device 1000 may have a display area DA and a non-display are NDA corresponding to those described above for the display device 1000. The display area DA may be a region where one or more of an image IM is displayed, and the non-display area NDA may be a region where the image IM is not displayed. FIG. 1A shows application icons as an example of the image IM.

The display area DA may have a tetragonal shape. The non-display area NDA may surround the display area DA. The invention, however, is not limited thereto, and the display area DA and the non-display area NDA may be relatively changed in shape.

The display device 1000 may include a first non-folding area NFA1, a folding area FA and a second non-folding area NFA2 that are sequentially defined along the second direction DR2. In an embodiment, for example, the folding area FA may be defined between the first non-folding area NFA1 and the second non-folding area NFA2. Although FIGS. 1A and 1B show one of the folding area FA and two non-folding areas (e.g., first non-folding area NFA1 and second non-folding area NFA2), limitations are imposed on neither the number of the folding area FA nor the number of the non-folding areas. In an embodiment, for example, the display device 1000 may include more than two non-folding areas and a plurality of folding areas which are disposed between the non-folding areas.

The display device 1000 may be flat at the non-folding areas, even when the display device 1000 is folded. The display device 1000 may be foldable about a folding axis FX. In an embodiment, for example, the folding area FA may be bendable about the folding axis FX. That is, the folding area FA is a planar area at which the display device 1000 is foldable. The folding axis FX may extend along the first direction DR1. The folding axis FX may be defined as a minor axis that is parallel to a short side of the display device 1000 having relatively short sides extended along the first direction DR1, and relatively long sides extended along the second direction DR2, without being limited thereto.

The display device 1000 which is folded disposes the first non-folding area NFA1 and the second non-folding area NFA2 facing each other. That is, the display device 1000 which is folded disposes portions of the display surface DS facing each other. Therefore, in the display device 1000 which is folded, the display surface DS may not face outside the display device 1000 and may not be exposed externally. This, however, is only an example, and the invention is not limited thereto. In an embodiment, the display device 1000 which is folded may dispose portions of the top surface at the first and second non-folding areas NFA1 and NFA2 to face in opposite directions (e.g., away from each other) to be face outside the display device 1000. Therefore, the display device 1000 which is folded disposes portions of the display surfaces DS facing outside the display device 1000 to be exposed externally.

Figure 2A:
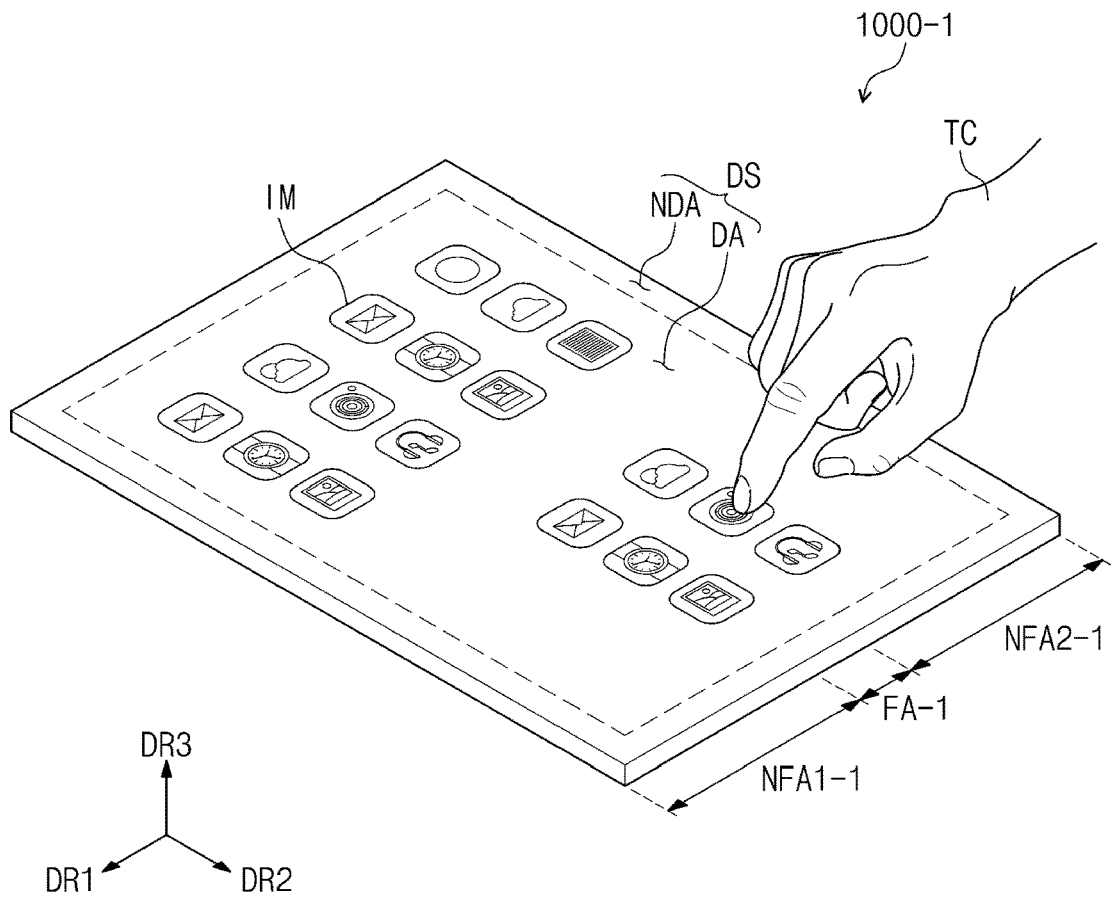
FIG. 2A illustrates a perspective view showing an embodiment of a display device.
Figure 2B:
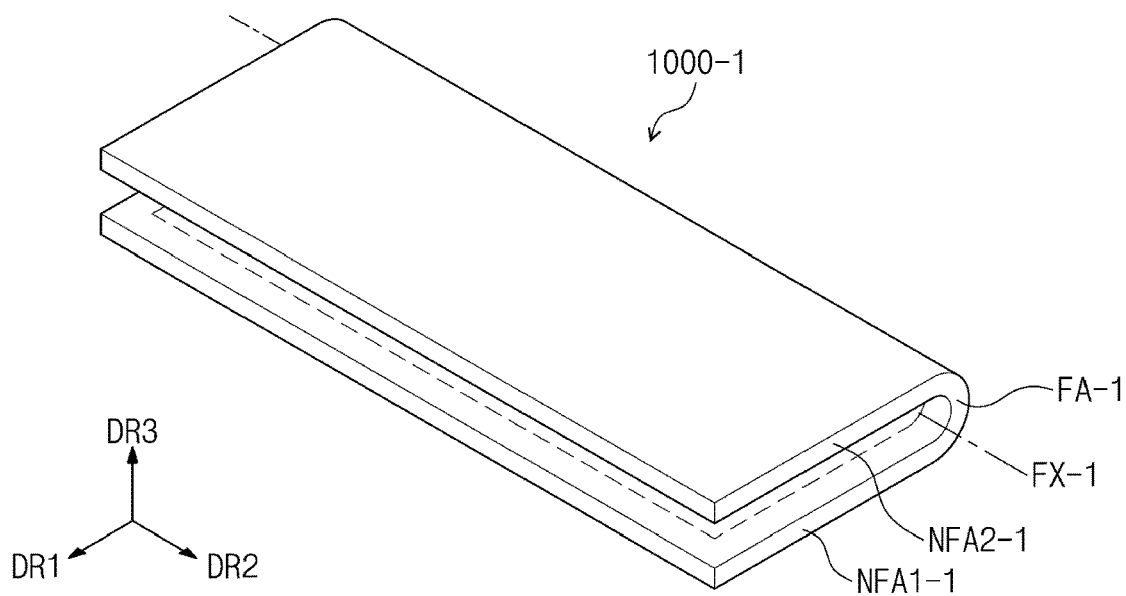
FIG. 2B illustrates a perspective view showing the display device depicted in FIG. 2A, which is folded.

FIG. 2A illustrates a perspective view showing a display device 1000-1. FIG. 2B illustrates a perspective view showing the display device 1000-1 depicted in FIG. 2A, which is folded.

Referring to FIGS. 2A and 2B, a display device 1000-1 may include a first non-folding area NFA1-1, a folding area FA-1 and a second non-folding area NFA2-1 that are sequentially defined along the first direction DR1. The folding area FA-1 may be defined between the first non-folding area NFA1-1 and the second non-folding area NFA2-1.

The display device 1000-1 may be foldable about a folding axis FX-1. In an embodiment, for example, the folding area FA-1 may be bendable about the folding axis FX-1. The folding axis FX-1 may extend along the second direction DR2. The folding axis FX-1 may be defined as a major axis parallel to a long side of the display device 1000-1.

The following will discuss a configuration of the display device 1000 that is foldable about the minor axis, but such description may also be applicable to the display device 1000-1 that is foldable about the major axis.

Figure 3:
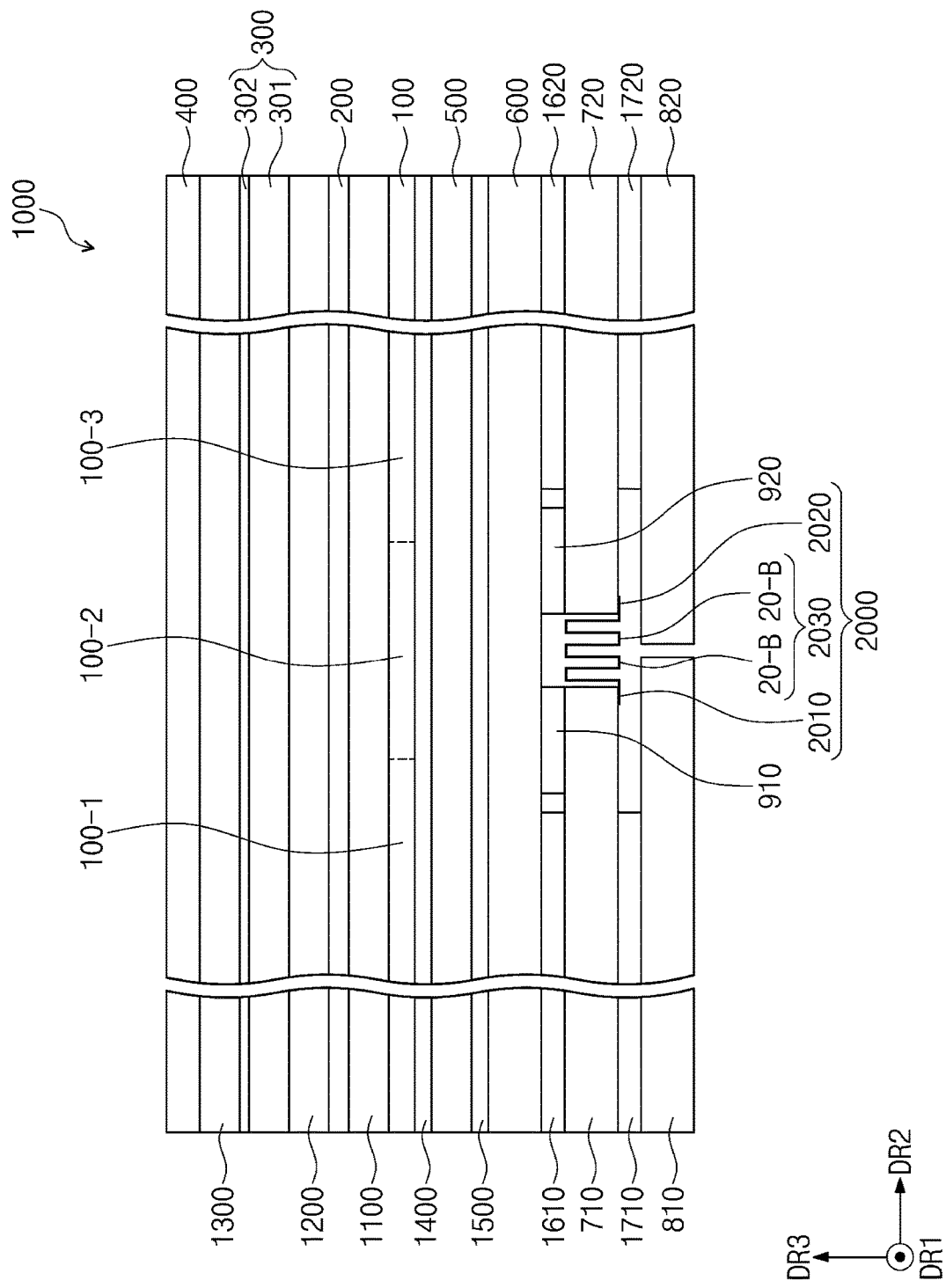
FIG. 3 illustrates a cross-sectional view showing an embodiment of a display device, which is unfolded.

FIG. 3 illustrates a cross-sectional view showing an embodiment of a display device 1000.

Referring to FIG. 3, the display device 1000 may include a display module 100, an antireflective layer 200, a window 300, an upper protective film 400, a lower protective film 500, a cushion layer 600, a plate layer including a first plate 710 and a second plate 720, and a component layer including a first set section 810 (e.g., first component portion) and a second set section 820 (e.g., second component portion).

The display module 100 may generate and/or display an image IM (FIG. 1A) and may detect an external input TC (FIG. 1A). The external input TC may be a touch of an input tool, a proximity of an input tool to the display device 1000 or display module 100, etc. The input tool may include a body of a user of the display device 1000, light, heat, pen, pressure or various other types of input tools. In FIG. 1A, the external input TC is illustrated as hand or finger of a user which is applied to the display surface DS, such as by a contact to the display surface DS. This, however, is only an example, and the external input TC may be provided in various types as discussed above. Depending on a structure of the display device 1000, the display device 1000 may detect the external input TC that is applied to a side surface or rear surface of the display device 1000, different from the top surface discussed above, but the invention is not limited thereto.

The display module 100 may include a display panel which generates an image, and an input sensing layer which obtains coordinate information of the external input TC.

The display panel may be, but not particularly limited to, a light emissive display panel. In an embodiment, for example, the display panel may be an organic light emitting display panel or a quantum-dot light emitting display panel. An emission layer of the organic light emitting display panel may include an organic light emitting material. An emission layer of the quantum-dot light emitting display panel may include a quantum-dot or a quantum-rod.

The input sensing layer may be directly disposed on the display panel. In an embodiment of a method for manufacturing the display device 1000, for example, the input sensing layer may be provided or formed directly on the display panel, in a successive process to a process of providing or forming the display panel. The input sensing layer may include a plurality of dielectric layers and a plurality of conductive layers. The plurality of conductive layers may constitute a sensing electrode that detects external inputs, a sensing line connected to the sensing electrode, and a sensing pad connected to the sensing line. The input sensing layer may detect external inputs in a mutual capacitance method and/or a self-capacitance method. The external input sensing method, however, is not limited to the example mentioned above.

The display module 100 may include a first region 100-1, a second region 100-2 and a third region 100-3 arranged in order. The first region 100-1 may correspond to the first non-folding area NFA1 of FIG. 1A, the second region 100-2 may correspond to the folding area FA of FIG. 1A, and the third region 100-3 may correspond to the second non-folding area NFA2 of FIG. 1A. In an embodiment, for example, the first and third regions 100-1 and 100-3 may be non-folding areas, and the second region 100-2 may be a folding area FA. A first boundary is defined between the first region 100-1 and the second region 100-2 and a second boundary is defined between the third region 100-3 and the second region 100-2.

The antireflective layer 200 may be disposed above or on the display module 100. The antireflective layer 200 may reduce a reflectance of external light that is incident from outside the display device 1000. The antireflective layer 200 may include a retarder and a polarizer. The retarder may be of a film type or a liquid crystal coating type, and may include a λ/2 retarder or a λ/4 retarder. The polarizer may also be of a film type or a liquid crystal coating type. The film type may include a stretchable synthetic resin film, and the liquid crystal coating type may include arrayed liquid crystals. The retarder and the polarizer may further include a protective film.

Alternatively, the antireflective layer 200 may include color filters. An arrangement of the color filters may be determined in consideration of colors of light emitted from pixels included in the display panel. The antireflective layer 200 may further include a black matrix adjacent to the color filters.

Alternatively, the antireflective layer 200 may include a destructive interference structure. In an embodiment, for example, the destructive interference structure may include a first reflective layer and a second reflective layer that are disposed at different levels. A first reflected light and a second reflected light, which are respectively reflected from the first reflective layer and the second reflective layer, may interfere destructively each other, and thus a reflectance of external light may be reduced.

A third adhesive layer 1100 may be disposed between the display module 100 and the antireflective layer 200. The display module 100 and the antireflective layer 200 may be coupled to each other through the third adhesive layer 1100. In an embodiment, the third adhesive layer 1100 may be omitted. Adhesive layers explained within this disclosure may include adhesives or glues. In an embodiment, for example, each of the adhesive layers may be a pressure sensitive adhesive ("PSA"), an optical clear adhesive ("OCA") or an optical clear resin ("OCR").

The window 300 may be disposed above or on the antireflective layer 200. The window 300 may include a base layer 301 and a functional layer which may be coated on the base layer to define a functional coating layer 302. The base layer 301 may include a glass substrate and/or a synthetic resin film. In an embodiment, for example, the base layer 301 may include a polyimide film. The base layer 301 is not limited to a single layer. The base layer 301 may include two or more films that are coupled to each other such as through an adhesive member. The functional coating layer 302 may include one or more of an anti-fingerprint layer, an antireflective layer and a hard coating layer.

A fourth adhesive layer 1200 may be disposed between the window 300 and the antireflective layer 200. Alternatively, the fourth adhesive layer 1200 may be omitted.

The upper protective film 400 may be disposed above or on the window 300. The addition of the upper protective film 400 may cause the display device 1000 to have improved impact resistance. The upper protective film 400 may define a top surface or outer surface of the display device 1000. The upper protective film 400 may be a polymer film or a tempered glass film.

A fifth adhesive layer 1300 may be disposed between the upper protective film 400 and the window 300. Alternatively, the fifth adhesive layer 1300 may be omitted. In an embodiment, the upper protective film 400 may be omitted.

The lower protective film 500 may be disposed below the display module 100. The lower protective film 500 may be a layer that protects a bottom surface of the display module 100. The lower protective film 500 may include a synthetic resin film, for example, a polyimide film or a polyethylene terephthalate film. This, however, is only an example, and the material of the lower protective film 500 is not limited to the mentioned above. A sixth adhesive layer 1400 may be disposed between the lower protective film 500 and the display module 100.

The cushion layer 600 may be disposed below the lower protective film 500. The cushion layer 600 may include sponge, foam or urethane resin. A seventh adhesive layer 1500 may be disposed between the lower protective film 500 and the cushion layer 600.

The first and second plates 710 and 720 may be disposed below the cushion layer 600. The first plate 710 may be placed below the first region 100-1 of the display module 100, and the second plate 720 may be placed below the third region 100-3 of the display module 100. A partial region of each of the first and second plates 710 and 720 may be placed below the second region 100-2. The first and second plates 710 and 720 may be spaced apart from each other at the second region 100-2 by an interval. In the display device 1000 which is flat or unfolded, the first and second plates 710 and 720 may form a gap space (e.g., first gap) therebetween. That is, the first and second plates 710 and 720 are disconnected from each other at the second region 100-2 corresponding to the folding area FA. Here, the first and second plates 710 and 720 may include side surfaces facing each other across the gap space, at the second region 100-2.

Each of the first and second plates 710 and 720 may be a metal plate. In an embodiment, for example, each of the first and second plates 710 and 720 may include a stainless steel, aluminum or an alloy thereof. The first and second plates 710 and 720 may have a strength (e.g., mechanical strength) greater than that of the display module 100.

A first intermediate adhesive layer 1610 may be disposed between the cushion layer 600 and the first plate 710. That is the cushion layer 600 and the first plate 710 may face each other with the first intermediate adhesive layer 1610 therebetween. A second intermediate adhesive layer 1620 may be disposed between the cushion layer 600 and the second plate 720. That is the cushion layer 600 and the second plate 720 may face each other with the second intermediate adhesive layer 1620 therebetween.

Each of the first and second intermediate adhesive layers 1610 and 1620 may define a top surface furthest from the plate layer and a bottom surface closest to the plate layer. The top surface and the bottom surface may be opposite to each other. Each of opposite surfaces of the first and second intermediate adhesive layers 1610 and 1620 may have adhesiveness. The first and second intermediate adhesive layers 1610 and 1620 may be spaced apart from each other at the second region 100-2 by an interval, and include side surfaces facing each other across the interval at the second region 100-2.

In the third direction DR3 parallel to a thickness direction of the display device 1000, the first intermediate adhesive layer 1610 may overlap the first region 100-1, and the second intermediate adhesive layer 1620 may overlap the third region 100-3. In addition, neither the first intermediate adhesive layer 1610 nor the second intermediate adhesive layer 1620 may overlap the second region 100-2. That is, the facing side surfaces of the first and second intermediate adhesive layers 1610 and 1620 may be spaced apart from the first boundary and the second boundary described above.

A portion of the cushion layer 600 which corresponds to the folding are FA is spaced apart from both the first plate 710 and the second plate 720, to form a gap space (e.g., second gap) therebetween. The second gap may be connected with the first gap described above, to form a single gap by which the portion of the cushion layer 600 is exposed to outside the plate layer.

A first step compensation film 910 may be disposed between the cushion layer 600 and the first plate 710. A second step compensation film 920 may be disposed between the cushion layer 600 and the second plate 720. A step compensation layer includes the first and second step compensation films 910 and 920. Each of the first and second step compensation films 910 and 920 may define a top surface furthest from the plate layer and a bottom surface closest to the plate layer. Each of the first and second step compensation films 910 and 920 may have one surface among the top and bottom surfaces, whose adhesiveness is less than that of the other surface among the top and bottom surfaces. In an embodiment, for example, the one surface may have no adhesiveness to be non-adhesive.

At the second region 100-2, the first step compensation film 910 may be adjacent to the first intermediate adhesive layer 1610, and the second step compensation film 920 may be adjacent to the second intermediate adhesive layer 1620. The first intermediate adhesive layer 1610, the first step compensation film 910, the second intermediate adhesive layer 1620 and the second step compensation film 920 are in order, in a direction along the display module 100. Therefore, the first intermediate adhesive layer 1610, the first step compensation film 910, the second step compensation film 920 and the second intermediate adhesive layer 1620 may be sequentially arranged along the second direction DR2. The first intermediate adhesive layer 1610, the first step compensation film 910, the second step compensation film 920 and the second intermediate adhesive layer 1620 which are sequentially arranged, are in a same layer of the display device 1000.

In a plan view (e.g., in the third direction DR3 parallel to a thickness direction of the display device 1000), the first and second step compensation films 910 and 920 may each overlap the second region 100-2. That is, the first step compensation film 910 in the first region 100-1 extends from the first region 100-2 and into the second region 100-2, while the second compensation film 920 in the third region 100-3 extends from the third region 100-3 and into the second region 100-2.

In the display module 100 which is unfolded, the first and second step compensation films 910 and 920 may support the second region 100-2 of the display module 100. In the display module 100 which is folded, the first and second step compensation films 910 and 920 may be spaced apart from the cushion layer 600.

A cover film 2000 may be attached to the first and second plates 710 and 720. The cover film 2000 may cover at least a portion of a gap space between the first and second plates 710 and 720. That is, the display device 1000 which is unfolded or folded, disposes the cover film 2000 covering a portion of the gap space between the first and second plates 710 and 720.

The cover film 2000 may include a first attachment region 2010 at a first end of the cover film 2000, a second attachment region 2020 at a second end of the cover film 2000 which is opposite to the first end, and a connection region 2030 connecting the first attachment region 2010 to the second attachment region 2020. The first attachment region 2010 may be attached to the first plate 710 at a first side surface thereof, and the second attachment region 2020 may be attached to the second plate 720 at a second side surface thereof, where the first and second side surfaces face each other across the gap space. In an embodiment, for example, the first attachment region 2010 may be attached to a bottom surface of the first plate 710, and the second attachment region 2020 may be attached to a bottom surface of the second plate 720. The first attachment region 2010 may be a planar area of the cover film 2000 at which the cover film 2000 is attached to the bottom surface of the first plate 710, and the second attachment region 2020 may be a planar area of the cover film 2000 at which the cover film 2000 is attached to a bottom surface of the second plate 720.

The connection region 2030 may be disposed connected between the first attachment region 2010 and the second attachment region 2020. The connection region 2030 may connect the first and second attachment regions 2010 and 2020 to each other, and may include a bending portion 20B (e.g., bent portion) provided in plurality along the gap space (e.g., a plurality of bending portions 20-B or bent portions). In an embodiment, for example, the connection region 2030 may be provided to include more than one fold or bend. The plurality of bending portions 20-B may be disposed between the first and second plates 710 and 720, particularly, between the facing side surfaces of the plate layer. The display device 1000 which is flat or unfolded may define an initial shape of the connection region 2030 including the plurality of bending portions 20-B. The display device 1000 which is bent of folded may change a shape of the connection region 2030 from the initial shape thereof.

The first plate 710 may correspond to the first set section 810, and the second plate 720 may correspond to the second set section 820. Each of the first and second set sections 810 and 820 within the component layer may include a functional component or a structural component of the display device 1000, such as a camera module, a mainboard, a battery or a housing. The first and second set sections 810 and 820 may form base layer of the display device 1000, without being limited thereto. The component layer including the first and second set sections 810 and 820 may form an outer surface (e.g., bottom surface) of the display device 1000, without being limited thereto.

A first adhesive layer 1710 may be adhered to the bottom surface of the first plate 710, and a second adhesive layer 1720 may be adhered to the bottom surface of the second plate 720. The first adhesive layer 1710 may couple the first plate 710 to the first set section 810, and the second adhesive layer 1720 may couple the second plate 720 to the second set section 820.

Figure 4:
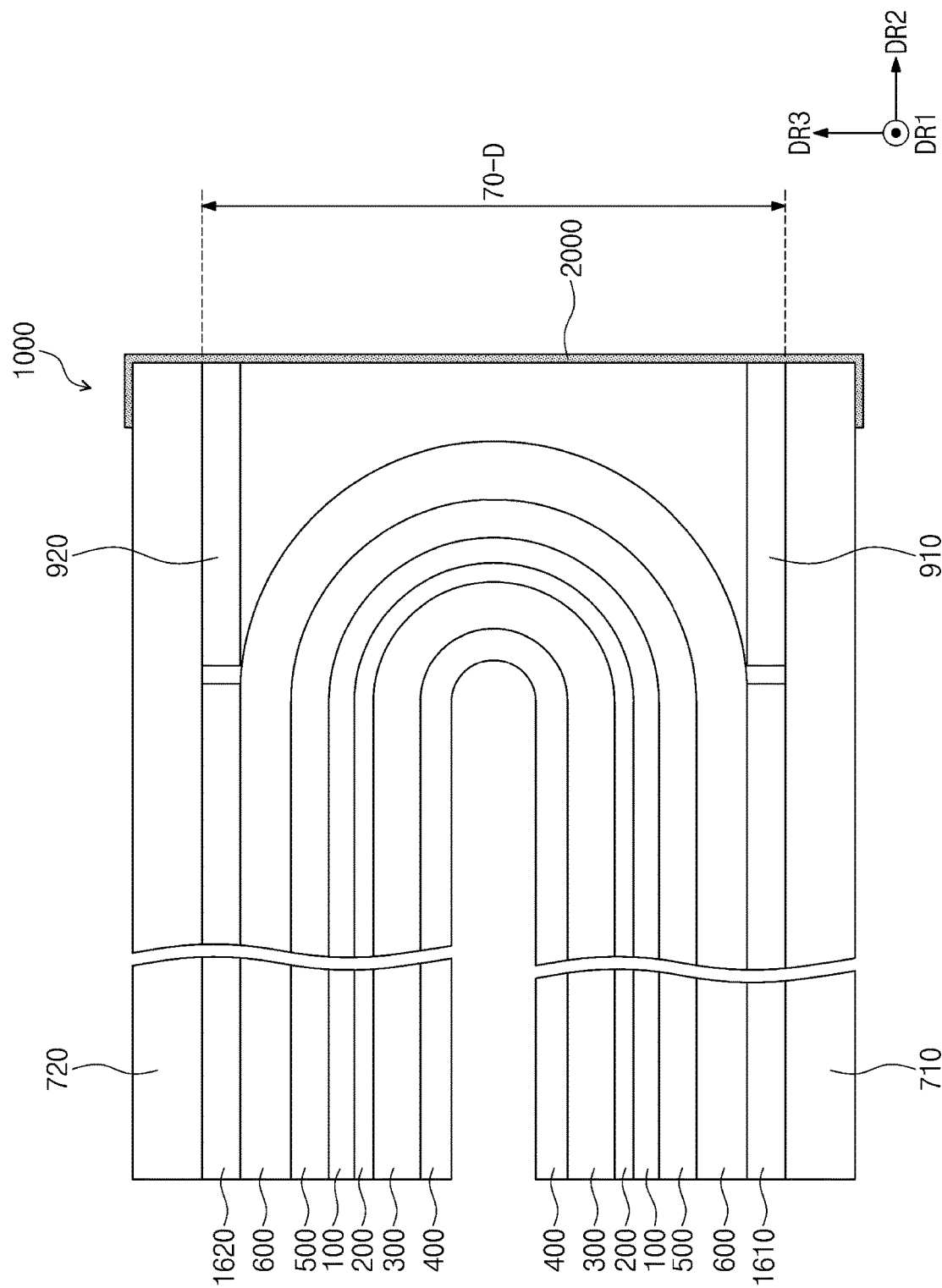
FIG. 4 illustrates a cross-sectional view showing an embodiment of a display device which is folded.

FIG. 4 illustrates a cross-sectional view showing an embodiment of an end portion of a display device 1000 which is folded.

FIG. 4 shows an embodiment of the display device 1000 of FIG. 3. For convenience of illustrate, the adhesive layers 1100, 1200, 1300, 1400 and 1500, the first set section 810, the second set section 820, the first adhesive layer 1710 and the second adhesive layer 1720 that are illustrated in FIG. 3, are omitted in FIG. 4.

Element layers of the display device 1000 may be foldable, deformable and/or movable together with each other. Referring to FIG. 4, the cushion layer 600 is foldable together with the display module 100. The cover film 2000 is deformable (e.g., elongated, straightened, etc.) together with folding or unfolding of the display module 100. The first plate 710 and the second plate 720 are movable together with the folding or unfolding of the display module 100.

An interval between the first and second plates 710 and 720 may be changed based on the shape of the display device 1000 which is bent or folded. The display device 1000 which folded, defines a distance 70-D between the first and second plates 710 and 720, along a thickness direction of the display device 1000. In an embodiment, for example, the first and second plates 710 and 720 may have therebetween a distance 70-D that becomes maximum when the display device 1000 is folded.

The display device 1000 which is unfolded disposes the folding area FA uncovered from the first plate 710 and the second plate 720. Referring back to FIG. 3, for example, since the first and second plates 710 and 720 are spaced apart from each other and from the cushion layer 600, a bottom surface of the cushion layer 600 may be exposed to outside the plate layer.

A shape of the cover film 2000 may be deformed in response to a variation in gap 70-G between the first and second plates 710 and 720. That is, the cover film 2000 is movable together with the first and second plates 710 and 720, in folding of the display device 1000. Referring to FIG. 4, for example, the display device 1000 which is folded disposes the cover film 2000 covering a portion of a gap space between the first and second plates 710 and 720. Therefore, entry of foreign substances into a second gap between the cushion layer 600 and the first step compensation film 910 and/or between the cushion layer 600 and the second step compensation film 920, from outside the display device 1000, is reduced or effectively prevented. As a result, the display device 1000 may have increased reliability.

The bottom surfaces of the plate layer may be furthest from the display module 100. Referring to FIG. 3, in the display device 1000 which is unfolded, the cover film 2000 extends from a bottom surface of the plate layer and into the gap space between the first and second plates 710 and 720. Referring to FIG. 4, in the display device 1000 which folded, the cover film 2000 is disposed outside of the space defined by the distance 70-D.

The cover film 2000 may be a flexible film. In an embodiment, for example, the cover film 2000 may include one or more of acryl-based resin, methacryl-based resin, polyisoprene, vinyl-based resin, epoxy-based resin, urethane-based resin, cellulose-based resin, siloxane-based resin, polyimide-based resin, polyamide-based resin and perylene-based resin. The cover film 2000 may be, for example, a thermoplastic polyurethane film.

Figure 5:
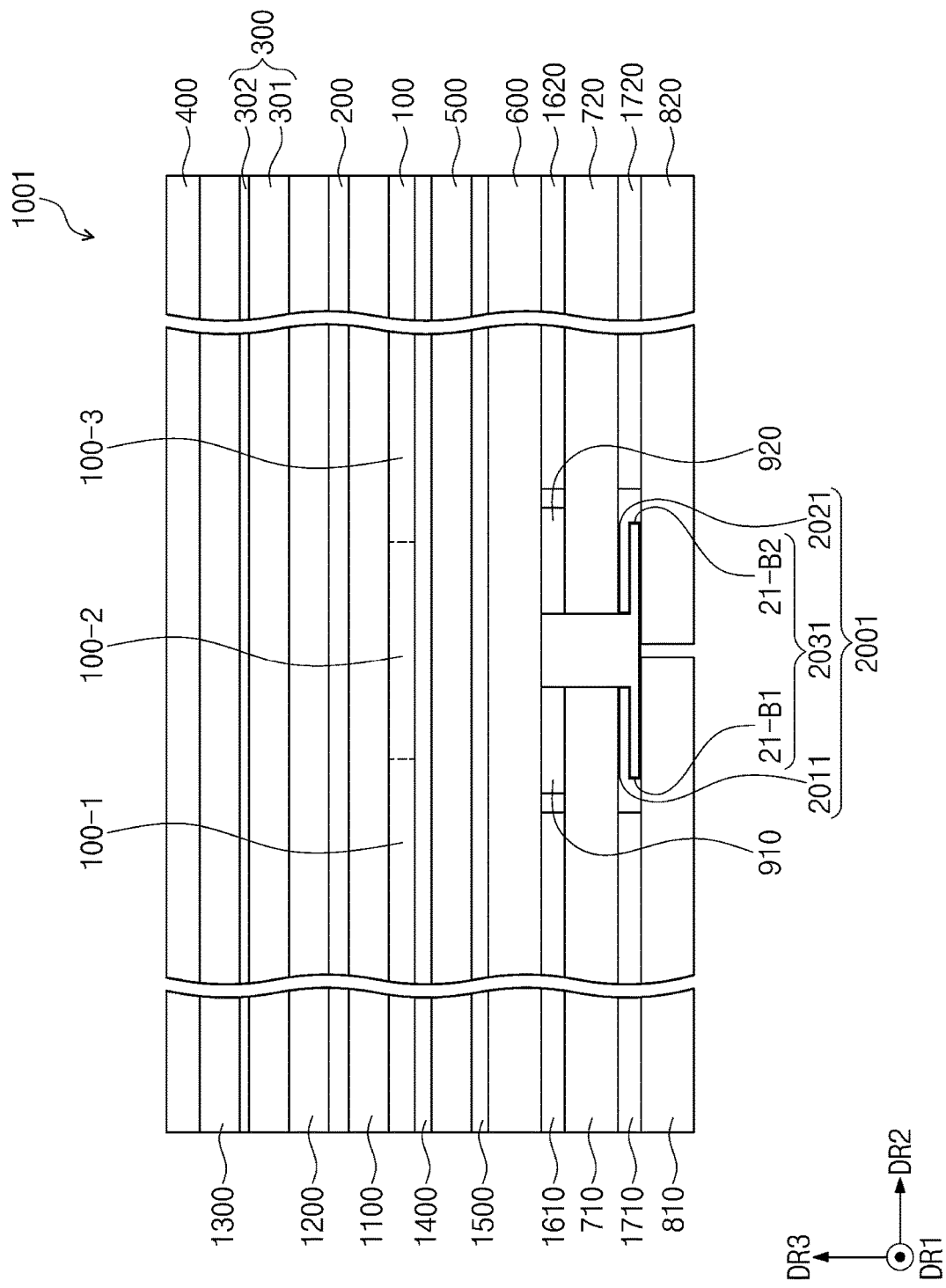
FIG. 5 illustrates a cross-sectional view showing an embodiment of a display device.

FIG. 5 illustrates a cross-sectional view showing an embodiment of a display device 1001. In the embodiment of FIG. 5, the same components as those shown in FIG. 3 are allocated the same reference symbols, and descriptions thereof will be omitted.

Referring to FIG. 5, a display device 1001 may include a cover film 2001. A same one of the cover film 2001 may be attached to the first plate 710 and the second plate 720. The cover film 2001 may cover at least a portion of a gap space between the first and second plates 710 and 720.

The cover film 2001 may include a first attachment region 2011, a second attachment region 2021 and a connection region 2031. The first attachment region 2011 may be attached to the bottom surface of the first plate 710, and the second attachment region 2021 may be attached to the bottom surface of the second plate 720.

The connection region 2031 may connect the first and second attachment regions 2011 and 2021 to each other, and may include a first bending portion 21-B1 provided in plurality (e.g., a plurality of first bending portions 21-B1) and a second bending portion 21-B2 provided in plurality (e.g., a plurality of second bending portions 21-B2). At least one of the first bending portion 21-B1 may be disposed between the first plate 710 and the first set section 810. At least one of the second bending portion 21-B2 may be disposed between the second plate 720 and the second set section 820.

Referring to FIG. 5, in the display device 1001 which is unfolded, the cover film 2001 extends from a bottom surface of the plate layer and in a direction away from the gap space between the first and second plates 710 and 720. Referring to FIG. 5 taken together with FIG. 4, the display device 1001 which is unfolded and folded, disposes an entirety of the cover film 2001 outside of the gap space between the first and second plates 710 and 720. The connection region 2031 covers the gap space between the first and second plates 710 and 720.

A shape of the connection region 2031 may be changed in response to deformation in shape of the display device 1001. The cover film 2001 may cover the bottom surface of the cushion layer 600 corresponding to the folding area FA. Therefore, entry of foreign substances into a gap between the cushion layer 600 and the first step compensation film 910 and/or between the cushion layer 600 and the second step compensation film 920, is reduced or effectively prevented. As a result, the display device 1001 may have increased reliability.

Figure 6:
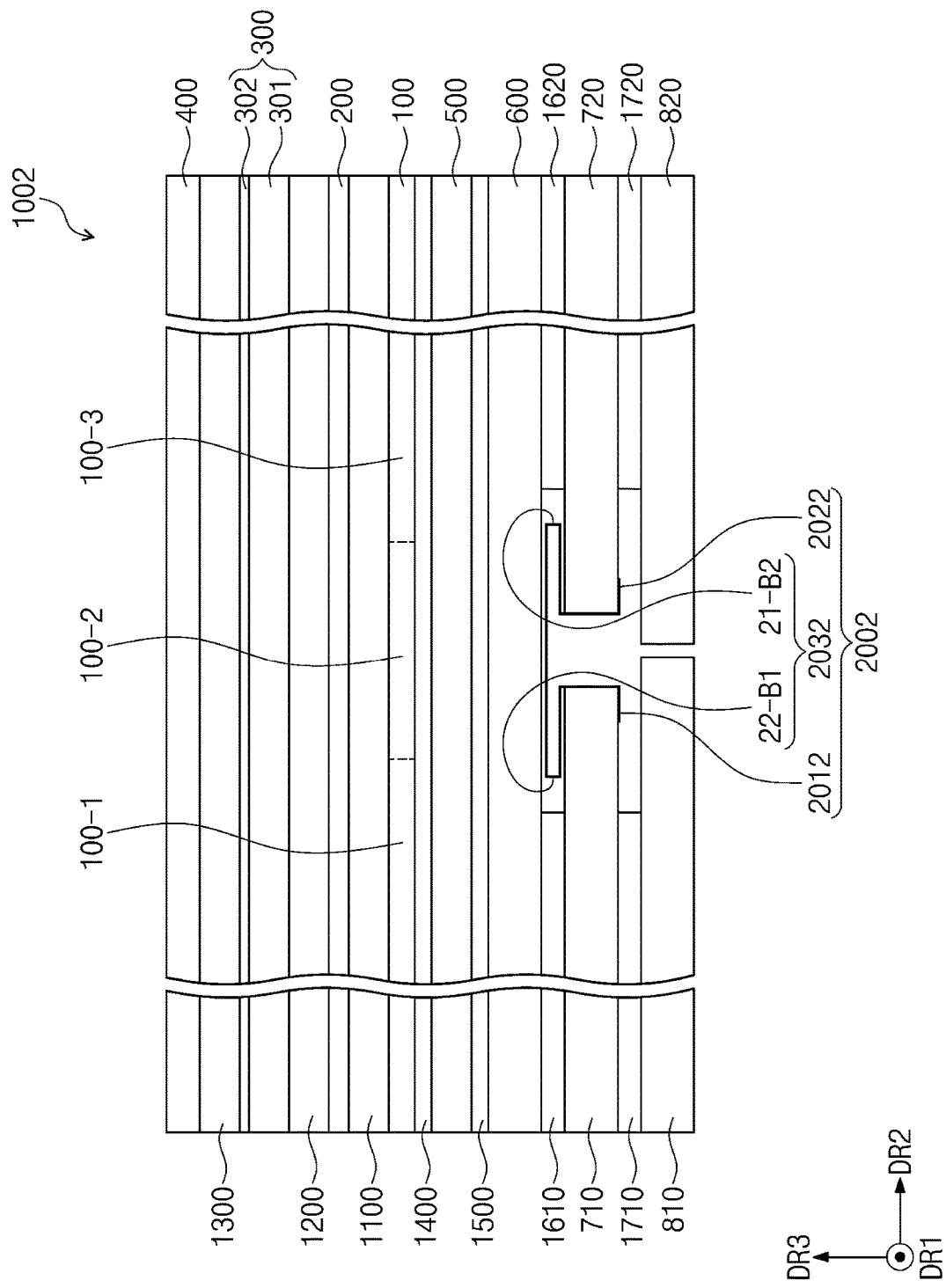
FIG. 6 illustrates a cross-sectional view showing an embodiment of a display device.

FIG. 6 illustrates a cross-sectional view showing an embodiment of a display device 1002. In the embodiment of FIG. 6, the same components as those shown in FIG. 3 are allocated the same reference symbols, and descriptions thereof will be omitted. Different from the display device 1000 of FIG. 3, the display device 1002 of FIG. 6 excludes both the first step compensation film 910 and the second step compensation film 920.

Referring to FIG. 6, the display device 1002 may include a cover film 2002. The cover film 2002 may be attached to the first plate 710 and the second plate 720. The cover film 2002 may cover at least a portion of a gap space between the first and second plates 710 and 720.

The cover film 2002 may include a first attachment region 2012, a second attachment region 2022 and a connection region 2032. The first attachment region 2012 may be attached to the bottom surface of the first plate 710, and the second attachment region 2022 may be attached to the bottom surface of the second plate 720.

The connection region 2032 may connect the first and second attachment regions 2012 and 2022 to each other, and may include a third bending portion 22-B1 provided in plurality (e.g., a plurality of third bending portions 22-B1) and a fourth bending portion 22-B2 provided in plurality (e.g., a plurality of fourth bending portions 22-B2). Referring to FIG. 6, in the display device 1002 which is unfolded, the cover film 2002 extends from a bottom surface of the plate layer and into the first gap between the first and second plates 710 and 720. The cover film 2002 which in the first gap extends into the second gap between the cushion layer 600 and each of the first and second plates 710 and 720.

The connection region 2032 may partially cover a side surface of each of the first and second plates 710 and 720. The third bending portion 22-B1 may be disposed between the first plate 710 and the cushion layer 600. The fourth bending portion 22-B2 may be disposed between the second plate 720 and the cushion layer 600. When the display module 100 is unfolded, the connection region 2032 of the cover film 2002 may support the second region 100-2 of the display module 100 instead of the first step compensation film 910 and the second step compensation film 920.

A shape of the connection region 2032 may be changed in response to deformation in shape of the display device 1002. The cover film 2002 may cover the bottom surface of the cushion layer 600 corresponding to the folding area FA. Therefore, entry of foreign substances into a second gap between the cushion layer 600 and the first plate 710 and/or between the cushion layer 600 and the second plate 720, may be reduced or effectively prevented. As a result, the display device 1002 may have increased reliability.

Figure 7:
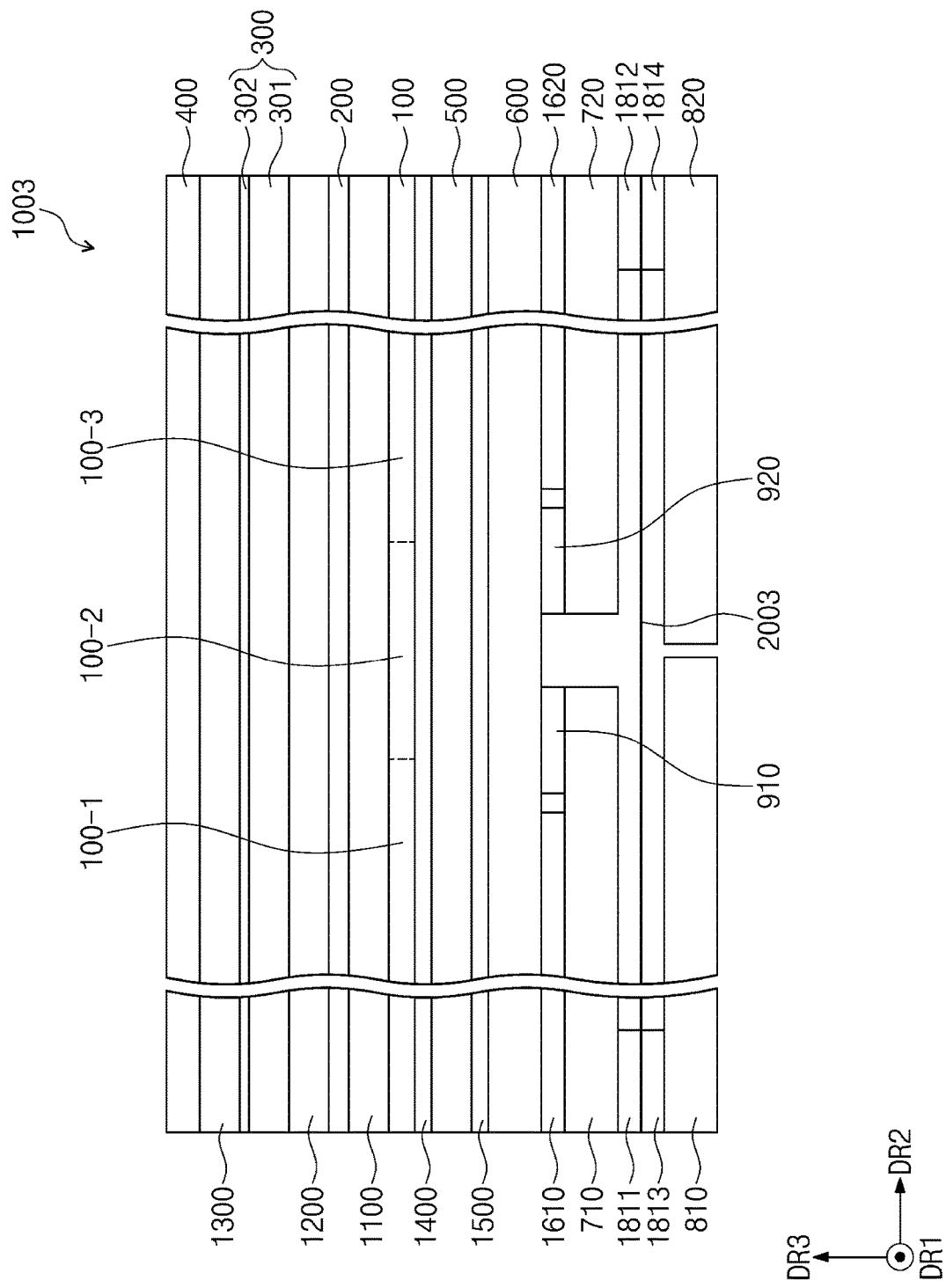
FIG. 7 illustrates a cross-sectional view showing an embodiment of a display device.

FIG. 7 illustrates a cross-sectional view showing an embodiment of a display device 1003. In the embodiment of FIG. 7, the same components as those shown in FIG. 3 are allocated the same reference symbols, and descriptions thereof will be omitted.

Referring to FIG. 7, a display device 1003 may include a cover film 2003. The cover film 2003 may be attached to the first plate 710 and the second plate 720. The cover film 2003 may cover at least a portion of a gap space between the first and second plates 710 and 720. In a direction along the display module 100 (e.g., second direction DR2 in FIG. 7), the display device 1003 which is unfolded disposes the cover film 2003 extending further than each of the first gap and the second gap.

An eighth adhesive layer 1811 may be disposed between the cover film 2003 and the first plate 710, and a ninth adhesive layer 1812 may be disposed between the cover film 2003 and the second plate 720. A tenth adhesive layer 1813 may be disposed between the cover film 2003 and the first set section 810, and an eleventh adhesive layer 1814 may be disposed between the cover film 2003 and the second set section 820.

The cover film 2003 may be a flexible film, and may include an elastic material. In an embodiment, for example, the cover film 2003 may include one or more of acryl-based resin, methacryl-based resin, polyisoprene, vinyl-based resin, epoxy-based resin, urethane-based resin, cellulose-based resin, siloxane-based resin, polyimide-based resin, polyamide-based resin and perylene-based resin. The cover film 2003 may be, for example, a thermoplastic polyurethane film.

The cover film 2003 may have a portion to which none of the eighth, ninth, tenth and eleventh adhesive layers 1811, 1812, 1813 and 1814 is attached. The portion of the cover film 2003 may have a length that is changeable in response to deformation in shape of the display device 1003. That is, the display device 1003 which is unfolded disposes the cover film 2003 having a first length, and the display device 1003 which is folded disposes the cover film 2003 having a second length different from the first length.

Figure 8:
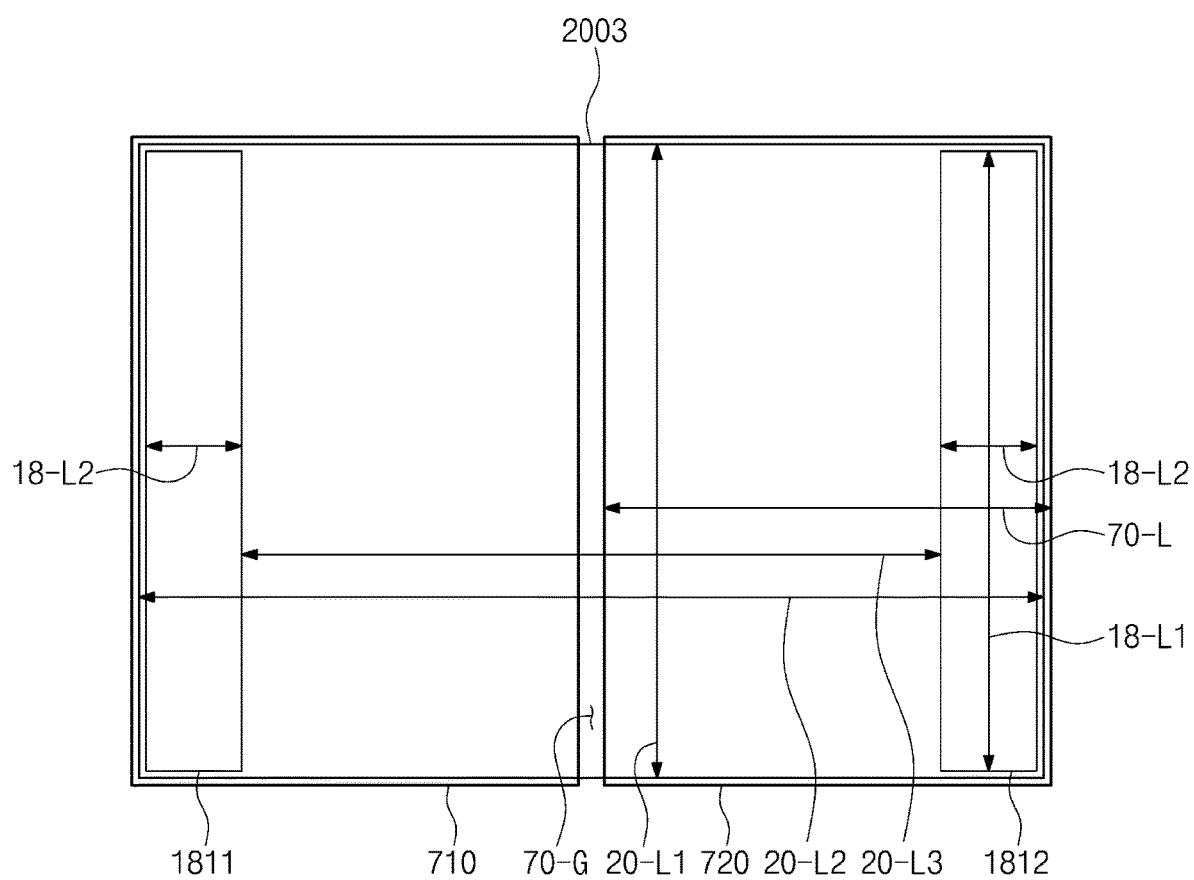
FIG. 8 illustrates a top plan view showing an embodiment of a display device.

FIG. 8 illustrates a top plan view showing an embodiment of a display device 1003 which is unfolded. FIG. 8 selectively shows the first plate 710, the second plate 720, the cover film 2003, the eighth adhesive layer 1811, and the ninth adhesive layer 1812. A folding axis FX of the display device 1003 is extended along the first direction DR1.

Referring to FIG. 8, each of the eighth and ninth adhesive layers 1811 and 1812 may have a bar shape that has a major dimension (e.g., length) along the first direction DR1 and a minor dimension (e.g., width) along the second direction DR2. Each of the eighth and ninth adhesive layers 1811 and 1812 may have a length 18-L1 along the first direction DR1 substantially the same as a first width 20-L1 along the first direction DR1 of the cover film 2003.

Each of the eighth and ninth adhesive layers 1811 and 1812 may have a width 18-L2 along the second direction DR2 less than a second width 70-L along the second direction DR2 of each of the first and second plates 710 and 720. In an embodiment, for example, the width 18-L2 may be about 10 millimeters (mm). However, the width 18-L2 is not limited to the example above, and may be variously changed based on product designs.

It may be defined that the cover film 2003 has a first length 20-L2 as a maximum dimension along the second direction DR2, and that the cover film 2003 has a second length 20-L3 along the second direction DR2 at a partial region to which neither the eighth adhesive layer 1811 nor the ninth adhesive layer 1812 is attached. In the display device 1003 which is unfolded, the second length 20-L3 may be a maximum distance between the eighth and ninth adhesive layers 1811 and 1812. The second length 20-L3 may be changed in response to deformation in shape of the display device 1003 of FIG. 7.

In an embodiment, for example, the first length 20-L2 may be about 120 mm, and the width 18-L2 may be about 10 mm. In this case, the second length 20-L3 may be about 100 mm. The first and second plates 710 and 720 which are spaced apart from each other may define a gap 70-G along the second direction DR2. The gap 70-G may be about 750 micrometers (μm). When the display device 1003 of FIG. 7 is folded, a variation in the distance 70-D of FIG. 4 between an end of the first plate 710 and an end of the second plate 720 may occur, at the end portion of the display device 1003.

Referring to FIG. 4 and FIG. 7 together, for example, the display device 1000 which is folded, defines a folding curvature. In an embodiment, when a folding curvature is about 2 mm, the distance 70-D may define about a 4,000 μm change to a length of the cover film 2003. In an embodiment, a difference of about 3.25 mm may be provided between the second length 20-L3 in the display device 1003 which is unfolded and the second length 20-L3 in the display device 1003 which is folded. The length variation of the second length 20-L3 may be about 3.25%. The second length 20-L3 may increase by folding of the display device 1003, from the top plan view shown in FIG. 8. The cover film 2003 may be elastic in response to the length variation.

Although not shown, the tenth adhesive layer 1813 of FIG. 7 may have a planar shape that corresponds to that of the eighth adhesive layer 1811, and the eleventh adhesive layer 1814 of FIG. 7 may have a planar shape that corresponds to that of the ninth adhesive layer 1812.

Figure 9:
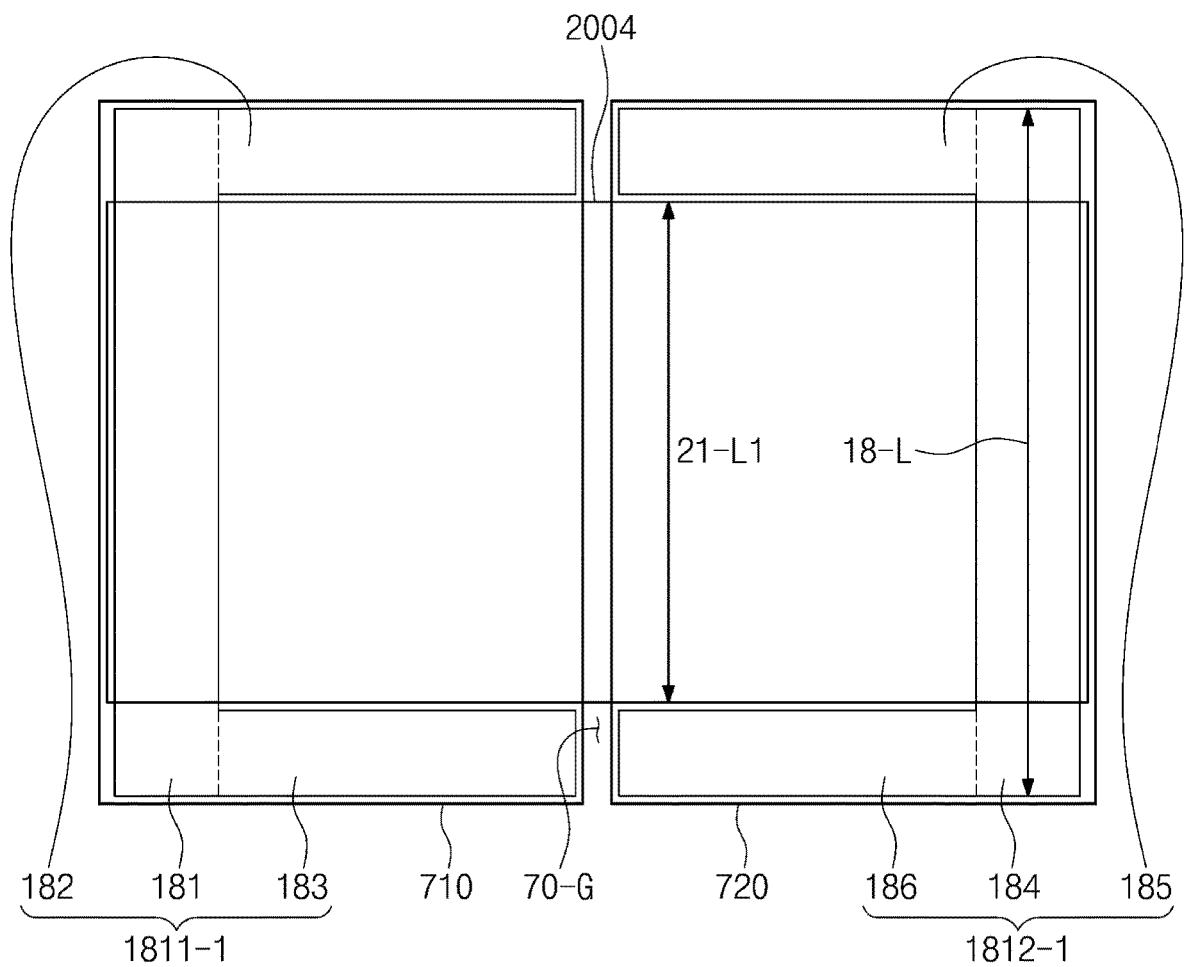
FIG. 9 illustrates a top plan view showing an embodiment of a display device.

FIG. 9 illustrates a plan view showing the first plate 710, the second plate 720, a cover film 2004, a thirteenth adhesive layer 1811-1, and a fourteenth adhesive layer 1812-1.

Referring to FIG. 9, the thirteenth adhesive layer 1811-1 may include a first adhesive region 181, a second adhesive region 182 and a third adhesive region 183, and the fourteenth adhesive layer 1812-1 may include a fourth adhesive region 184, a fifth adhesive region 185 and a sixth adhesive region 186.

Each of the first and fourth adhesive regions 181 and 184 may extend along the first direction DR1. Each of the first and fourth adhesive regions 181 and 184 may have a length 18-L in the first direction DR1 that corresponds to a maximum length in the first direction DR1 of each of the thirteenth and fourteenth adhesive layers 1811-1 and 1812-1. The first and fourth adhesive regions 181 and 184 may correspond to the eighth and ninth adhesive layers 1811 and 1812 discussed above.

The second adhesive region 182 may lengthwise extend along the second direction DR2 from a first end of the first adhesive region 181, and the third adhesive region 183 may lengthwise extend along the second direction DR2 from a second end of the first adhesive region 181 which is opposite to the first end thereof. The fifth adhesive region 185 may lengthwise extend along the second direction DR2 from a first end of the fourth adhesive region 184, and the sixth adhesive region 186 may lengthwise extend along the second direction DR2 from a second end of the fourth adhesive region 184 which is opposite to the first end thereof. Along the second direction DR2, the second adhesive region 182, the third adhesive region 183, the fifth adhesive region 185 and the sixth adhesive region 186, may each be disposed between the first adhesive region 181 and the fourth adhesive region 184.

The cover film 2004 may have a first width 21-L1 along the first direction DR1 less than the length 18-L along the first direction DR1. The cover film 2004 may be selectively attached to the first and fourth adhesive regions 181 and 184, and may be unattached to each of the second, third, fifth and sixth adhesive regions 182, 183, 185, and 186. In the plan view, the cover film 2004 may be disposed between the second and third adhesive regions 182 and 183, and between the fifth and sixth adhesive regions 185 and 186, along the first direction DR1.

Although not shown, the tenth adhesive layer 1813 of FIG. 7 may have a planar shape that corresponds to that of the thirteenth adhesive layer 1811-1, and the eleventh adhesive layer 1814 of FIG. 7 may have a planar shape that corresponds to that of the fourteenth adhesive layer 1812-1. In an embodiment, for example, the second and third adhesive regions 182 and 183 may be adhered to the tenth adhesive layer 1813 of FIG. 7, and the fifth and sixth adhesive regions 185 and 186 may be adhered to the eleventh adhesive layer 1814 of FIG. 7.

Referring to FIGS. 8 and 9 together with FIG. 7, the cover film 2003 and the cover film 2004 are attached to the plate layer, at an ends of the plate layer which are furthest from the folding area FA. In FIGS. 3, 5 and 6, the cover film 2000, the cover film 2001 and the cover film 2002 are attached to the plate layer at locations of the first and second plates 710 and 720 which are closest to the folding area FA.

According to one or more embodiment, a shape of a cover film 2000 may be deformed in response to a variation in gap 70-G between first and second plates 710 and 720. The cover film 2000 may cover at least a portion of a region between the first and second plates 710 and 720. Therefore, entry of foreign substances into the gap 70-G between the first and second plates 710 and 720 may be reduced or effectively prevented. As a result, a display device 1000 may have increased reliability.

Although embodiments have been described with reference to a number of illustrative examples thereof, it will be understood by those of ordinary skill in the art that various changes in form and details may be made without departing from the spirit and scope of the invention as set forth in the following claims. Thus, the technical scope of the invention is not limited by the embodiments and examples described above, but by the following claims.

What is claimed is:

1. A display device, comprising:
   a display module including a first region, a second region and a third region arranged in order;
   a first plate corresponding to the first region of the display module;
   a second plate corresponding to the third region of the display module and spaced apart from the first plate at the second region of the display module, to define a gap between the first plate and the second plate, at the second region;
   a cover film which is extended across the gap and attached to the first plate and the second plate at a plurality of attachment regions outside of the gap; and,
   a first intermediate adhesive layer, a first step compensation film, a second step compensation film, and a second intermediate adhesive layer in order, in a direction along the display module,
   wherein the display module which is unfolded, disposes:
     the first intermediate adhesive layer between the display module and the first plate and corresponding to the first region of the display module;
     the first step compensation film between the display module and the first plate and corresponding to the second region of the display module;
     the second intermediate adhesive layer between the display module and the second plate and corresponding to the third region of the display module;
     the second step compensation film between the display module and the second plate and corresponding to the second region of the display module; and
     the first step compensation film spaced apart from the second step compensation film at the second region of the display module.

2. The display device of claim 1, wherein the cover film comprises:
   a first attachment region at which the cover film is attached to the first plate;
   a second attachment region at which the cover film is attached to the second plate; and a connection region between the first attachment region and the second attachment region, and the display module which is unfolded, disposes the connection region including a plurality of bent portions corresponding to the second region of the display module.

3. The display device of claim 2, wherein the first plate and the second plate each include a bottom surface which is furthest from the display module, the first attachment region of the cover film extends along the bottom surface of the first plate and is attached to the bottom surface of the first plate, and the second attachment region of the cover film extends along the bottom surface of the second plate and is attached to the bottom surface of the second plate.

4. The display device of claim 2, wherein the display module which is unfolded, disposes the plurality of bent portions of the cover film, in the gap between the first plate and the second plate.

5. The display device of claim 2, wherein the display module which is unfolded, disposes along a thickness direction of the display device, the plurality of bent portions comprising:

a first bent portion between the first plate and the display module; and a second bent portion between the second plate and the display module.

6. The display device of claim 2, wherein the display module which is unfolded, disposes along a thickness direction of the display device, the plurality of bent portions comprising:

a first bent portion facing the display module with the first plate therebetween; and a second bent portion facing the display module with the second plate therebetween.

7. The display device of claim 2, wherein the display module which is unfolded, disposes:

the first plate including a side surface facing the second plate, and the second plate including a side surface facing the first plate, and the cover film extending along the side surface of the first plate and along the side surface of the second plate.

8. The display device of claim 1, further comprising:

a first adhesive layer between the cover film and the first plate; and a second adhesive layer between the cover film and the second plate.

9. The display device of claim 8, wherein the display module which is unfolded, disposes:

the first adhesive layer having a bar shape extended along a first direction, and the second adhesive layer having a bar shape extended along the first direction.

10. The display device of claim 9, wherein the display module which is unfolded, disposes:

each of the first adhesive layer and the second adhesive layer including a length along the first direction, and the cover film including a width along the first direction, wherein the length along the first direction is substantially the same as the width of the cover film, along the first direction.

11. The display device of claim 8, wherein the display module which is unfolded, disposes:

the first adhesive layer corresponding to the first region of the display module, and the second adhesive layer corresponding to the third region of the display module, and spaced apart from the first adhesive layer at the second region of the display module, wherein the first adhesive layer comprises:

a first adhesive region furthest from the second adhesive layer and extended along a first direction;

a second adhesive region extended along a second direction from a first end of the first adhesive region, the second direction intersecting the first direction; and a third adhesive region extended along the second direction from a second end of the first adhesive region which is opposite to the first end thereof, the second adhesive layer comprises:

a fourth adhesive region furthest from the first adhesive layer and extended along the first direction;

a fifth adhesive region extended along the second direction from a first end of the fourth adhesive region; and a sixth adhesive region extended along the second direction from a second end of the fourth adhesive region which is opposite to the first end thereof, and along the second direction, each of the second adhesive region, the third adhesive region, the fifth adhesive region and the sixth adhesive region are between the first adhesive region and the fourth adhesive region.

12. The display device of claim 11, wherein the cover film includes a width along the first direction, wherein the second adhesive region spaces apart from the third adhesive region by a distance along the first direction, and wherein the width of the cover film is less than the distance between the second adhesive region and the third adhesive region.

13. The display device of claim 1, further comprising a folding area at which the display device is foldable, and a non-folding area extended from the folding area:

wherein the first region and the third region of the display module correspond to the non-folding area, and the second region of the display module corresponds to the folding area.

14. The display device of claim 13, wherein the display module which is unfolded, disposes:

the first plate corresponding to the first region of the display module and extending into the second region which corresponds to the folding area, and the second plate corresponding to the third region of the display module and extending into the second region which corresponds to the folding area.

15. The display device of claim 1, wherein the display module which is unfolded is flat;

the display module which is folded disposes the first region and the third region facing each other;

the first plate is movable together with folding or unfolding of the display module;

the second plate is movable together with the folding or unfolding of the display module; and the cover film is deformable together with the folding or unfolding of the display module.

16. The display device of claim 1, wherein the cover film includes a flexible film.

17. A display device, comprising:

a display module which is foldable and unfoldable, the display module comprising:

a folding area at which the display module is foldable, and a first non-folding area and a second non-folding area facing each other with the folding area therebetween;

a first plate corresponding to the first non-folding area of the display module, the first plate movable together with folding or unfolding of the display module;

a second plate corresponding to the second non-folding area of the display module and spaced apart from the first plate at the folding area to define a gap space therebetween, at the folding area, the second plate movable together with the folding or unfolding of the display module;

a cover film deformable together with the folding or unfolding of the display module; and a first intermediate adhesive layer, a first step compensation film, a second step compensation film, and a second intermediate adhesive layer in order, in a direction along the display module, wherein the cover film covers the gap space which is between the first plate and the second plate and is attached to the first plate and the second plate at a plurality of attachments regions outside of the gap space, and the display module which is unfolded, disposes:

the first intermediate adhesive layer between the display module and the first plate and corresponding to the first non-folding area of the display module;

the first step compensation film between the display module and the first plate and corresponding to the folding area of the display module;

the second intermediate adhesive layer between the display module and the second plate and corresponding to the second non-folding area of the display module;

the second step compensation film between the display module and the second plate and corresponding to the folding area of the display module; and the first step compensation film spaced apart from the second step compensation film at the folding area of the display module.

18. The display device of claim 17, wherein the cover film comprises:

a first attachment region at which the cover film is attached to the first plate;

a second attachment region at which the cover film is attached to the second plate; and a connection region between the first attachment region and the second attachment region, and the display module which is unfolded, disposes the connection region including a plurality of bent portions corresponding to the gap space which is between the first plate and the second plate.

19. The display device of claim 17, further comprising:

a first adhesive layer between the cover film and the first plate; and a second adhesive layer between the cover film and the second plate, wherein each of the first adhesive layer and the second adhesive layer includes a length along a first direction, and the cover film includes a width along the first direction, and wherein the length along the first direction is equal to or greater than the width of the cover film along the first direction.

* * * * *